United States Patent
Obata et al.

(10) Patent No.: US 12,302,629 B2
(45) Date of Patent: May 13, 2025

(54) SEMICONDUCTOR DEVICE

(71) Applicant: FUJI ELECTRIC CO., LTD., Kanagawa (JP)

(72) Inventors: Tomoyuki Obata, Matsumoto (JP); Soichi Yoshida, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 853 days.

(21) Appl. No.: 17/159,102

(22) Filed: Jan. 26, 2021

(65) Prior Publication Data

US 2021/0151429 A1 May 20, 2021

Related U.S. Application Data

(63) Continuation of application No. PCT/JP2019/047282, filed on Dec. 3, 2019.

(30) Foreign Application Priority Data

Feb. 7, 2019 (JP) .................................. 2019-021007

(51) Int. Cl.
*H10D 84/60* (2025.01)
*H10D 12/00* (2025.01)

(52) U.S. Cl.
CPC ......... *H10D 84/617* (2025.01); *H10D 12/441* (2025.01)

(58) Field of Classification Search
None
See application file for complete search history.

(56) References Cited

U.S. PATENT DOCUMENTS

| 2004/0012049 A1 | 1/2004 | Shirai |
| 2008/0230810 A1 | 9/2008 | Yoshimura |
| 2013/0141963 A1 | 6/2013 | Liaw |
| 2015/0108564 A1 | 4/2015 | Miura |

(Continued)

FOREIGN PATENT DOCUMENTS

| CN | 103151071 A | 6/2013 |
| CN | 104285301 A | 1/2015 |

(Continued)

OTHER PUBLICATIONS

Extended European Search Report for European Patent Application No. 19914534.3, issued by the European Patent Office on Nov. 9, 2021.

(Continued)

*Primary Examiner* — Nilufa Rahim

(57) ABSTRACT

A semiconductor device is provided, including: a semiconductor substrate; an active portion provided on the semiconductor substrate; a first well region and a second well region provided on the semiconductor substrate and arranged sandwiching the active portion in a top view; a peripheral well region provided on the semiconductor substrate and arranged enclosing the active portion in a top view; an intermediate well region provided on the semiconductor substrate and arranged between the first well region and the second well region in a top view; a first pad arranged above the first well region and a second pad arranged above the second well region; and a temperature sense diode arranged above the intermediate well region.

17 Claims, 9 Drawing Sheets

(56) References Cited

U.S. PATENT DOCUMENTS

| | | | |
|---|---|---|---|
| 2016/0211256 A1* | 7/2016 | Tsumura | H01L 27/0629 |
| 2016/0358869 A1 | 12/2016 | Godo | |
| 2017/0077004 A1 | 3/2017 | Onozawa | |
| 2017/0111037 A1 | 4/2017 | Shiigi | |
| 2017/0162562 A1* | 6/2017 | Haruguchi | H01L 29/1004 |
| 2017/0162662 A1* | 6/2017 | Naito | H01L 29/41708 |
| 2017/0236908 A1* | 8/2017 | Naito | H01L 29/36 257/48 |
| 2017/0263603 A1* | 9/2017 | Hata | H01L 27/0727 |
| 2018/0076193 A1 | 3/2018 | Shirakawa | |
| 2018/0166549 A1* | 6/2018 | Kato | H01L 29/7397 |
| 2018/0350960 A1* | 12/2018 | Naito | H01L 29/7397 |
| 2019/0189796 A1* | 6/2019 | Su | H01L 21/266 |
| 2020/0168714 A1* | 5/2020 | Oda | H01L 29/78 |
| 2020/0335622 A1* | 10/2020 | Hiyoshi | H01L 29/1608 |

FOREIGN PATENT DOCUMENTS

| | | |
|---|---|---|
| JP | H0252468 A | 2/1990 |
| JP | H11214691 A | 8/1999 |
| JP | 2004055812 A | 2/2004 |
| JP | 2004363327 A | 12/2004 |
| JP | 2006019608 A | 1/2006 |
| JP | 2007234850 A | 9/2007 |
| JP | 2007287988 A | 11/2007 |
| JP | 2012235001 A | 11/2012 |
| JP | 2014003095 A | 1/2014 |
| JP | 2017059672 A | 3/2017 |
| JP | 2017079324 A | 4/2017 |
| JP | 2018046187 A | 3/2018 |
| WO | 2015198435 A1 | 12/2015 |
| WO | 2018038133 A1 | 3/2018 |
| WO | WO-2019039304 A1 * | 2/2019 ......... H01L 21/8234 |

OTHER PUBLICATIONS (ISA/237) Written Opinion of the International Search Authority for International Patent Application No. PCT/JP2019/047282, issued/mailed by the Japan Patent Office on Mar. 3, 2020.

Office Action issued for counterpart Chinese Application 201980050332.1, issued by The State Intellectual Property Office of People's Republic of China on Jul. 7, 2024.

* cited by examiner

SEMICONDUCTOR DEVICE

The contents of the following Japanese patent applications are incorporated herein by reference:
NO. 2019-021007 filed in JP on Feb. 7, 2019, and
NO. PCT/JP2019/047282 filed in WO on Dec. 3, 2019

BACKGROUND

1. Technical Field

The present invention relates to a semiconductor device.

2. Related Art

Conventionally, semiconductor devices have been known in which elements such as IGBTs (insulated gate bipolar transistors) are formed (refer to Patent Document 1 and 2, for example).
Patent Document 1: Japanese Unexamined Patent Application, Publication No. 2017-59672.
Patent Document 2: Japanese Unexamined Patent Application, Publication No. 2004-55812.
Semiconductor devices preferably have high withstand capabilities.

GENERAL DISCLOSURE

To solve the above problem, a first aspect of the present invention provides a semiconductor device including a semiconductor substrate. The semiconductor device may include an active portion provided on the semiconductor substrate. The semiconductor device may include a first well region and a second well region provided on the semiconductor substrate and arranged sandwiching the active portion in a top view. The semiconductor device may include a peripheral well region provided on the semiconductor substrate and arranged enclosing the active portion in a top view. The semiconductor device may include an intermediate well region provided on the semiconductor substrate and arranged between the first well region and the second well region in a top view. The semiconductor device may include a first pad arranged above the first well region and a second pad arranged above the second well region. The semiconductor device may include a temperature sense diode arranged above the intermediate well region.

The first well region and the second well region may protrude more to a center side of the active portion than the peripheral well region.

The semiconductor substrate may have a first end side and a second end side facing each other in a top view. The first well region may be arranged between the active portion and the first end side. The second well region may be arranged between the active portion and the second end side.

The semiconductor device may include a gate runner connected to the first pad. The first pad may be arranged in the center of the first end side.

The gate runner may have an active peripheral portion enclosing the active portion in a top view. The gate runner may have a first well peripheral portion enclosing the first well region in a top view. The gate runner may have a second well peripheral portion enclosing the second well region in a top view.

The first well peripheral portion may be arranged in the center of the first end side. The second well peripheral portion may be arranged in the center of the second end side.

The intermediate well region may be provided from the first well region to the second well region in a top view.

The intermediate well region may have a wide portion having a width that is wider than other portions in a direction in which the first well region and the second well region are connected in a top view. A temperature sense diode may be arranged above the wide portion.

The gate runner may have an annular portion enclosing the temperature sense diode in a top view. The gate runner may have a first extending portion provided from the first well region to the annular portion. The gate runner may have a second extending portion provided extending from the second well region to the annular portion.

A second aspect of the present invention provides a semiconductor device including a semiconductor substrate. The semiconductor device may include an active portion provided on the semiconductor substrate. The semiconductor device may include a gate runner provided on the semiconductor substrate and arranged traversing the active portion in a top view. The semiconductor device may include a temperature sense diode arranged above the semiconductor substrate. The gate runner may have an annular portion enclosing the temperature sense diode in a top view. The gate runner may have a first extending portion extending from one end of the annular portion to one end of the active portion. The gate runner may have a second extending portion extending from the other end of the annular portion to the other end of the active portion.

The summary clause does not necessarily describe all necessary features of the embodiments of the present invention. The present invention may also be a sub-combination of the features described above.

DESCRIPTION OF EXEMPLARY EMBODIMENTS

Figure 1:
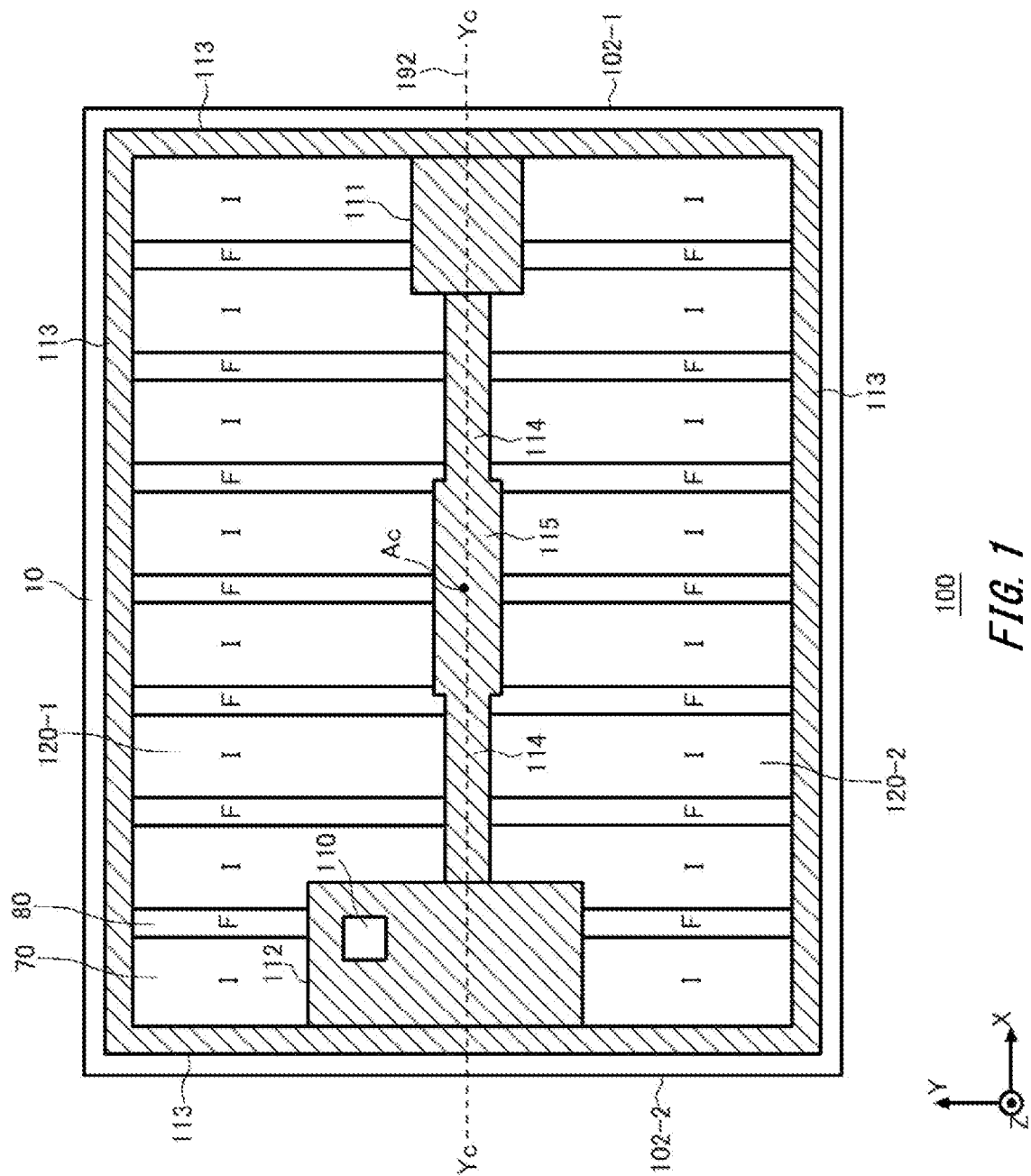
FIG. 1 illustrates a top view of one example of a semiconductor device 100 according to one embodiment of the present invention.

Hereinafter, the present invention will be described with reference to embodiments of the invention. However, the following embodiments shall not be construed as limiting the claimed invention. Also, not all combinations of features described in the embodiments are essential for means to solve problems provided by aspects of the invention.

In this specification, one side of the semiconductor substrate in the direction parallel to the depth direction is referred to as "upper" and the other side is referred to as "lower". Of the two principal surfaces of the substrate, layer or other member, one surface is referred to as the upper surface and the other surface is referred to as the lower surface. The directions of "upper" and "lower" are not limited to the direction of gravity or the direction in which the semiconductor device is mounted.

In this specification, the orthogonal coordinate axes of the X, Y and Z axes may be used to describe technical matters. The orthogonal coordinate axes only identify the relative positions of the components and does not limit the specific direction. For example, the Z axis does not indicate a limited height direction with respect to the ground. Additionally, the +Z axis direction and the −Z axis direction are opposite directions to each other. When described as the Z axis direction without describing positive or negative, it means the direction parallel to the +Z and −Z axes. And in this specification, viewing from the +Z axis direction may be referred to as a top view.

In this specification, when referred to as "same" or "equal", it may also include cases with errors due to manufacturing variation and the like. The errors in this case are, for example, within 10%.

In this specification, the conductive type of the doping region doped with impurities is described as P type or N type. However, the conductive type of each doping region may also be of the opposite polarity. Also, in this specification, when described as P+ type or N+ type, it means the doping concentration is higher than P type or N type; when described as P− type or N− type, it means the doping concentration is lower than P type or N type.

In this specification, the doping concentration refers to the concentration of impurities activated as the donor or acceptor. In this specification, the concentration difference of the donor and acceptor may be the higher concentration of the donor or acceptor. The concentration difference in this case can be measured by voltage-capacitance measurement method (CV method). Also, the carrier concentration measured by spreading resistance measurement method (SR) may be the concentration of the donor or acceptor. Also, when there is a peak in concentration distribution of the donor or acceptor, the peak value in this case may be the concentration of the donor or acceptor in the region. When the concentration of the donor or acceptor is approximately uniform in a region where the donor or acceptor exists, the average value of the concentration of the donor or acceptor in the region may be the concentration of the donor or acceptor.

FIG. 1 illustrates a top view of one example of a semiconductor device 100 according to one embodiment of the present invention. The semiconductor device 100 includes a semiconductor substrate 10. The semiconductor substrate 10 is a substrate formed by semiconductor materials such as silicon or compound semiconductors. The semiconductor substrate 10 has an end side 102 in a top view. The semiconductor substrate 10 of this example has two groups of end sides 102 facing each other in a top view. FIG. 1 illustrates a first end side 102-1 and a second end side 102-2 of one group facing each other. In FIG. 1, the direction parallel to the first end side 102-1 and the second end side 102-2 is the Y axis direction; the direction perpendicular to the first end side 102-1 and the second end side 102-2 is the X axis direction.

On the semiconductor substrate 10, an active portion 120 is provided. The active portion 120 is the region where a main current flows in the depth direction between the upper surface and the lower surface of the semiconductor substrate 10, when the semiconductor device 100 is controlled to the on state. Therefore, in FIG. 1, the inside region of the well region illustrated by diagonal lines may be the active portion 120. In the active portion 120, a transistor portion 70 including transistor elements such as IGBTs (insulated gate bipolar transistors) may be provided. In the active portion 120, a diode portion 80 including diode elements such as FWDs (freewheeling diodes) may also be provided. The active portion 120 may be the region has at least one of the transistor portion 70 and the diode portion 80 provided.

In FIG. 1, the region where the transistor portion 70 is arranged is marked with symbol "I" and the region where the diode portion 80 is arranged is marked with symbol "F". The transistor portion 70 and the diode portion 80 may be arranged alternately in the X axis direction. When the active portion 120 is divided in a top view, in each region of the active portion 120, the transistor portion 70 and the diode portion 80 may be alternately arranged in the X axis direction.

On the semiconductor substrate 10, a P type well region is provided. The well region has a higher doping concentration than the base region described below, and is formed in contact with the upper surface of the semiconductor substrate 10, in a position deeper than the bottom portion of the base region. The depth in this case is the depth with the upper surface of the semiconductor substrate 10 as the reference position. FIG. 1 illustrates an exemplary arrangement of the well region on the upper surface of the semiconductor substrate 10. In FIG. 1, the well region is hatched with diagonal lines.

The well region is a relatively high-concentration P type region, which makes it difficult for an electron current to flow. Thus, if the well region is unevenly arranged, the region in which an electron current is difficult to flow will be biased. The semiconductor device 100 in this example arranges the well region in a top view with good balance, thus arranges the region in which an electron current is difficult to flow with good balance. Thereby, by suppressing the bias of the electron current, the withstand capability of the semiconductor device 100 can be improved.

The semiconductor device 100 has a first well region 111 and a second well region 112. The first well region 111 and the second well region 112 are arranged sandwiching active portion 120 in the predetermined direction (the X axis direction in FIG. 1). The two well regions sandwiching the active portion 120 refers to either straight line connecting the two well regions passing through the active portion 120 in a top view.

The first well region 111 may be arranged near the first end side 102-1. That is, the distance between the first well region 111 and the first end side 102-1 is less than the distance between the first well region 111 and the second end side 102-2. The second well region 112 may be arranged near the second end side 102-2. That is, the distance between the second well region 112 and the second end side 102-2 is less than the distance between the second well region 112 and the first end side 102-1.

The first well region 111 in this example is arranged between the active portion 120 and the first end side 102-1 in the X axis direction. The active portion 120 is not provided between the first well region 111 and the first end side 102-1. That is, the first well region 111 is arranged between one end of the X axis direction of the active portion 120 and the first end side 102-1. The active portion 120 may have a side parallel to the first end side 102-1. The first well region 111 may be provided protruding from the side of the active portion 120 toward the inside of the active portion 120.

The second well region 112 in this example is arranged between the active portion 120 and the second end side 102-2 in the X axis direction. The active portion 120 is not provided between the second well region 112 and the second end side 102-2. That is, the second well region 112 is arranged between the end of the X axis direction of the active portion 120 and the second end side 102-2. The active portion 120 may have a side parallel to the second end side 102-2. The second well region 112 may be provided protruding from the side of the active portion 120 toward the inside of the active portion 120.

The first well region 111 may be provided in the range including the center position Yc of the first end side 102-1 in the Y axis direction. The second well region 112 may be provided in the range including the center position Yc of the second end side 102-2 in the Y axis direction. The first well region 111 may be sandwiched by the active portion 120 in the Y axis direction. The second well region 112 may be sandwiched by the active portion 120 in the Y axis direction. The second well region 112 may be provided in a wider range in the Y axis direction than the first well region 111.

The second well region 112 may also enclose the predetermined region in a top view. The second well region 112 in this example encloses the current detection portion 110 provided on the semiconductor substrate 10. Although the current detection portion 110 has the same structure as the transistor portion 70, its area is smaller than the transistor portion 70 in a top view. In the current detection portion 110, a current proportional to the main current in the transistor portion 70 flows.

The semiconductor device 100 has a peripheral well region 113 arranged enclosing the active portion 120 in a top view. The peripheral well region 113 may be provided parallel to each end side of the semiconductor substrate 10. The peripheral well region 113 in this example is a circular region enclosing the active portion 120 in a top view. The peripheral well region 113 may have a constant width in the direction perpendicular to each end side of the semiconductor substrate 10.

The first well region 111 and the second well region 112 in this example protrude more to the center Ac side of the active portion 120 than the peripheral well region 113. The center Ac of the active portion 120 is the geometric center of gravity of the active portion 120 in a top view. In other examples, at least one of the first well region 111 and the second well region 112 may also be arranged between the peripheral well region 113 and the end side 102 of the semiconductor substrate 10. In this case, at least one of the first well region 111 and the second well region 112 protrudes from the peripheral well region 113 to the end side 102.

The semiconductor device 100 has an intermediate well region 114 that divides the active portion 120 in a top view. The active portion 120 may be divided into two or more regions by the well regions including the intermediate well region 114. The intermediate well region 114 has a longitudinal length in a predetermined well longitudinal direction. The intermediate well region 114 in this example extends along the well longitudinal direction and traverses the active portion 120. In FIG. 1, the well longitudinal direction is the X axis direction.

The intermediate well region 114 is provided between the first well region 111 and the second well region 112. The intermediate well region 114 may have one end of the longitudinal direction connected to the first well region 111, and the other end connected to the second well region 112. The intermediate well region 114 may be provided in a region that overlaps the center Ac of the active portion 120.

As described below, a temperature sense diode is arranged above the intermediate well region 114. In the semiconductor device including the temperature sense diode, the first well region 111 and the second well region 112 are arranged sandwiching the active portion 120, and the intermediate well region 114 is arranged between the first well region 111 and the second well region 112, allowing these well regions to be arranged in a distributed manner in a top view. Accordingly, the well regions can be arranged with good balance without bias. Thus, localized current concentration can be suppressed.

As described above, the first well region 111 and the second well region 112 are preferably provided in a range including the center position Yc of the end side 102. Thereby, the well regions can be arranged with better balance.

The intermediate well region 114 may have a wide portion 115 in the direction perpendicular to the well longitudinal direction (the Y axis direction in this example) than other portions in a top view. The wide portion 115 is also provided between the first well region 111 and the second well region 112. The wide portion 115 may be arranged in the center between the first well region 111 and the second well region 112. The wide portion 115 may be provided in a region that overlaps the center Ac of the active portion 120. The wide portion 115 may also be arranged in the regions including the center of the well longitudinal direction of the intermediate well region 114. The temperature sense diode is arranged above the wide portion 115. In this way, in the semiconductor device including a temperature sense diode, well regions can be arranged with good balance.

In FIG. 1, the line connecting the center position Yc of the first end side 102-1 and the center position Yc of the second end side 102-2 is referred to as straight line 192. The straight line 192 in this example is the straight line bisecting the semiconductor substrate 10 in the Y axis direction. The first well region 111, the second well region 112 and the intermediate well region 114 may be provided above the straight line 192. That is, each region of the first well region 111, the second well region 112 and the intermediate well region 114 has an overlapped portion with the straight line 192. Thereby, in the semiconductor device including a temperature sense diode, well regions can be arranged with good balance.

The semiconductor device 100 may also include an edge termination structure portion between the peripheral well region 113 and the end side 102 of the semiconductor substrate 10. The edge termination structure portion relaxes the electric field concentration on the upper surface side of the semiconductor substrate 10. The edge termination structure portion has, for example, a guard ring, a field plate, a RESURF and a combination of these structures provided annularly enclosing the active portion 120.

Figure 2:
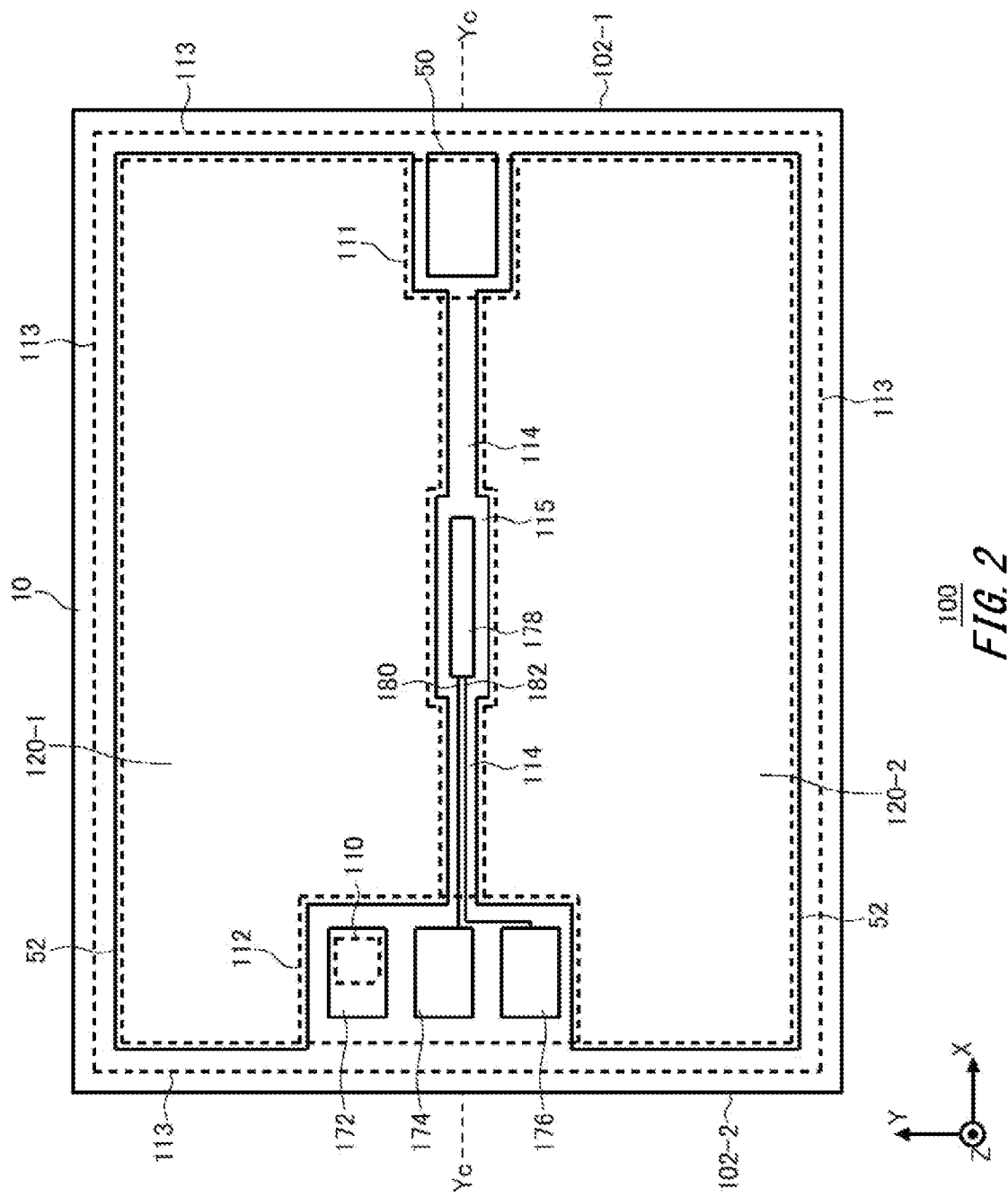
FIG. 2 illustrates a temperature sense diode 178, an emitter electrode 52 and each pad arranged above the semiconductor substrate 10.

FIG. 2 illustrates a temperature sense diode 178, an emitter electrode 52 and each pad arranged above the semiconductor substrate 10. The semiconductor device 100 in this example has a gate pad 50, a current detection pad 172, an anode pad 174 and a cathode pad 176. The gate pad 50 is one example of the first pad arranged above the first well region 111. The current detection pad 172, the anode pad 174 and the cathode pad 176 are examples of the second pad arranged above the second well region 112.

In FIG. 2, each well region illustrated in FIG. 1 is illustrated by dashed lines. The temperature sense diode 178, the emitter electrode 52 and each pad are illustrated by solid lines. The temperature sense diode 178 in this example is a PN junction diode formed of semiconductor materials such as a polysilicon.

The temperature sense diode 178 is arranged above the wide portion 115. That is, at least a part of the temperature sense diode 178 overlaps at least a part of the wide portion 115. The temperature sense diode 178 in this example has half or more of its region overlapped with the wide portion 115 in a top view. The temperature sense diode 178 may also wholly overlap the wide portion 115.

The anode region and the cathode region of the temperature sense diode 178 are connected with the anode wiring 180 and the cathode wiring 182. The anode wiring 180 and the cathode wiring 182 are wirings containing metals such as aluminum. The anode wiring 180 and the cathode wiring 182 are arranged above the intermediate well region 114. An insulating film is provided between the temperature sense diode 178, the anode wiring 180, and the cathode wiring 182 and the semiconductor substrate 10.

The emitter electrode 52 and each pad are electrodes containing metals such as aluminum. An insulating film is provided between the emitter electrode 52 and each pad, and the semiconductor substrate 10. The emitter electrode 52 and each pad, and the semiconductor substrate 10 are connected via contact holes provided on the insulating film. In FIG. 2, the insulating film and the contact holes are omitted.

The emitter electrode 52 is arranged above the active portion 120. The emitter electrode 52 is connected to the active portion 120 via the contact holes described above. To the upper surface of the emitter electrode 52, wires, lead frames, or the like are connected, and a predetermined emitter voltage is applied. The emitter electrode 52 and each pad are provided away from each other in a top view. Wires or the like are connected to the upper surface of each pad. The emitter electrode 52 may be provided for each of the active portion 120-1 and the active portion 120-2. The emitter electrode 52 may also be provided to connect the active portion 120-1 and the active portion 120-2. Additionally, the emitter electrode 52 may also be partially arranged above each well region.

A predetermined gate voltage is applied to the gate pad 50. The gate voltage applied to the gate pad 50 is supplied to the transistor portion of the active portion 120, by the gate runner or the like that is described below. The gate pad 50 is arranged above the first well region 111. That is, at least a part of the gate pad 50 and at least a part of the first well region 111 are overlapped. Half or more of the region of the gate pad 50 of this example overlaps the first well region 111 in a top view. The gate pad 50 may also wholly overlap the first well region 111.

The current detection pad 172 is connected to the current detection portion 110, and detects the current flowing in the current detection portion 110. The anode pad 174 is connected to the temperature sense diode 178 via the anode wiring 180. The cathode pad 176 is connected to the temperature sense diode 178 via the cathode wiring 182. The current detection pad 172, the anode pad 174 and the cathode pad 176 are arranged above the second well region 112. For each pad of the current detection pad 172, the anode pad 174 and the cathode pad 176, at least a part of the pads overlaps at least a part of the second well region 112. A half or more of regions of the current detection pad 172, the anode pad 174 and the cathode pad 176 of this example, overlap the second well region 112 in a top view. The current detection pad 172, the anode pad 174 and the cathode pad 176 may also wholly overlap the second well region 112.

Figure 3:
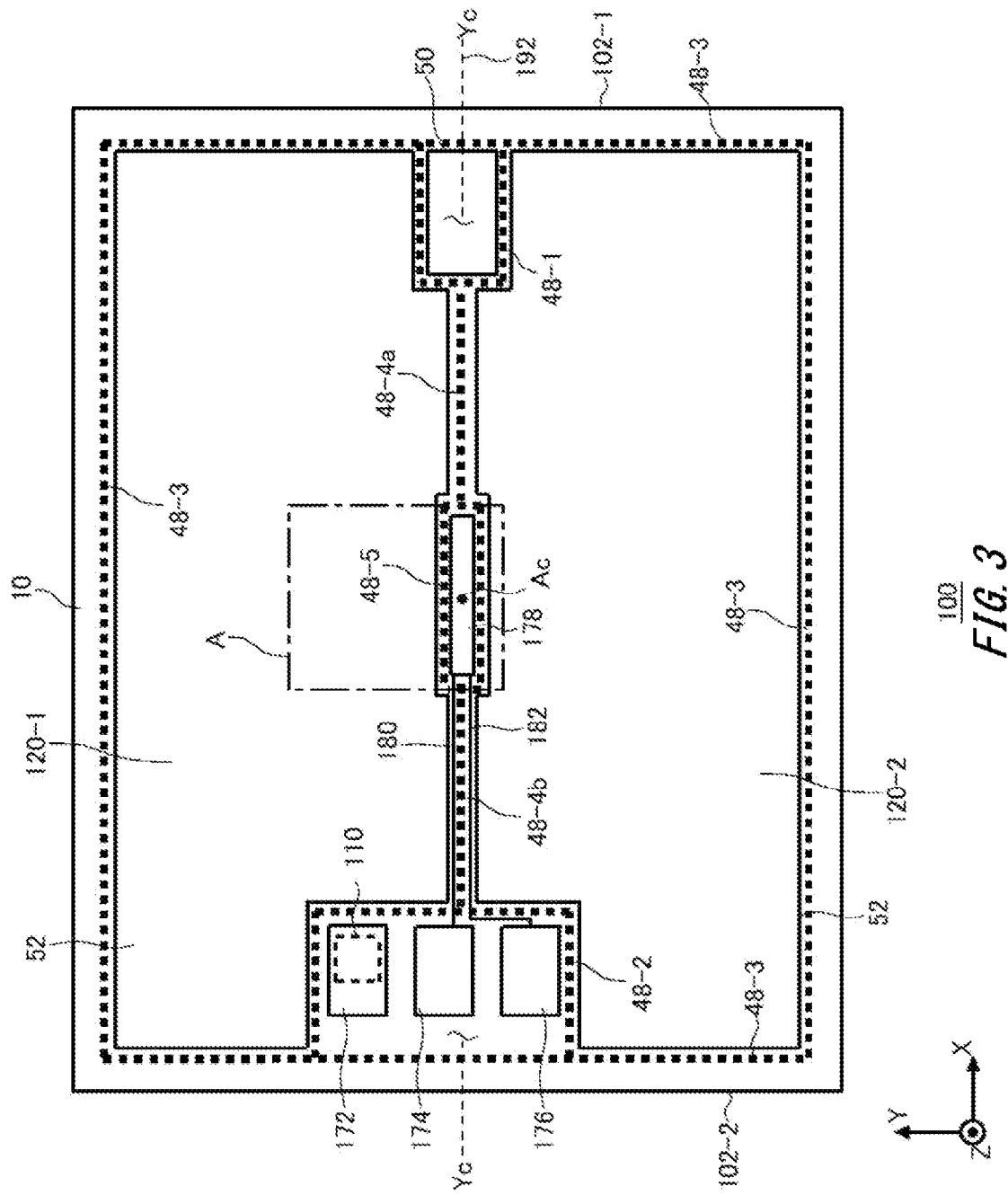
FIG. 3 illustrates an exemplary arrangement of a gate runner 48 on the upper surface of the semiconductor device 100.

FIG. 3 illustrates an exemplary arrangement of the gate runner 48 on the upper surface of the semiconductor device 100. In FIG. 3, the emitter electrode 52, the temperature sense diode 178 and each pad are illustrated by solid lines, and the gate runner 48 is illustrated by dashed lines. In FIG. 3, each well region is omitted.

The gate runner 48 is a wiring formed of polysilicon with impurities added, or conductive materials such as metals. The gate runner 48 is arranged above the semiconductor substrate 10. An insulating film is provided between the gate runner 48 and the semiconductor substrate 10. The gate runner 48 is connected to the gate pad 50, and supplies the gate voltage that is applied to the gate pad 50, to each transistor portion 70. The gate runner 48 may be arranged above the well regions.

The gate pad 50 is arranged in the center position Yc in the Y axis direction of the first end side 102-1. That is, the gate pad 50 is arranged to overlap the straight line 192. The straight line 192 may pass through the center in the Y axis direction of the gate pad 50. That is, a gate pad 50 may be arranged between respective parts of the active portion 120 divided by the straight line 192. FIG. 3 illustrates the active portions 120-1 and 102-2 that are divided by the straight line 192. According to this example, the length of the gate pad 50 and the gate runner 48 up to the transistor portion 70 can be equalized between the two active portions 120-1 and 120-2.

The gate runner 48 of this example includes the active peripheral portion 48-3 arranged enclosing the active portion 120 in a top view. The active peripheral portion 48-3 may be arranged between the active portion 120 and each end side 102 of the semiconductor substrate 10 in a top view. The active peripheral portion 48-3 of this example is arranged above the peripheral well region 113 illustrated in FIG. 1. The active peripheral portion 48-3 may have a portion parallel to each end side 102 of the semiconductor substrate 10. A first well region 111, a second well region 112, and an intermediate well region 114 may be arranged in the region enclosed by the active peripheral portion 48-3.

The active peripheral portion 48-3 arranged along the first end side 102-1 is connected to the gate pad 50. As the gate pad 50 is arranged in the center of the end side 102, the length of the active peripheral portion 48-3 connecting the active portion 120-1 and the gate pad 50, and the length of the active peripheral portion 48-3 connecting the active portion 120-2 and the gate pad 50 can be equalized. This enables the equalization of the amplitude attenuation and the transmission delay of the gate voltage between the active portion 120-1 and the active portion 120-2. Thus, in the active portion 120, the localized current concentration can be suppressed, and the withstand capability of the semiconductor device 100 can be improved.

The gate runner 48 of this example includes a first well peripheral portion 48-1 arranged enclosing the first well region 111 in a top view. The first well peripheral portion 48-1 may also enclose a part of the first well region 111. The first well peripheral portion 48-1 of this example is arranged above the first well region 111 illustrated in FIG. 1. The first well peripheral portion 48-1 may have a portion parallel to each end side of the first well region 111. The first well peripheral portion 48-1 may be arranged enclosing at least a part of the gate pad 50 in a top view. At least a part of the first well peripheral portion 48-1 may be arranged between the gate pad 50 and the emitter electrode 52 (or the active portion 120) in a top view.

The first well peripheral portion 48-1 may be arranged at the center position Yc of the first end side 102-1. That is, the straight line 192 passes through the region enclosed by the first well peripheral portion 48-1. According to this example, the shape in a top view of the first well peripheral portion 48-1 can be approximately linearly symmetrical with respect to the straight line 192. Thus, the amplitude attenuation and transfer delay of the gate voltage can be equalized between the active portions 120-1 and 120-2, which are halved by the straight line 192.

The gate runner 48 of this example includes a second well peripheral portion 48-2 arranged enclosing the second well region 112 in a top view. The second well peripheral portion 48-2 may also enclose a part of the second well region 112. The second well peripheral portion 48-2 of this example is arranged above the second well region 112 illustrated in FIG. 1. The second well peripheral portion 48-2 may have a portion parallel to each end side of the second well region 112. The second well peripheral portion 48-2 may be arranged enclosing at least a part of the current detection pad 172, the anode pad 174 and the cathode pad 176 in a top view. At least a part of the second well peripheral portion 48-2 may be arranged between the current detection pad 172 and the emitter electrode 52 (or the active portion 120) in a top view. At least a part of the second well peripheral portion 48-2 may be arranged between the anode pad 174 and the emitter electrode 52 (or the active portion 120) in a top view. At least a part of the second well peripheral portion 48-2 may be arranged between the cathode pad 176 and the emitter electrode 52 (or the active portion 120) in a top view.

The second well peripheral portion 48-2 may be arranged at the center position Yc of the second end side 102-2. That is, the straight line 192 passes through the region enclosed by the second well peripheral portion 48-2. According to this example, the shape of the second well peripheral portion 48-2 in a top view can be approximately linearly symmetrical with respect to the straight line 192. Thus, the amplitude attenuation and transfer delay of the gate voltage can be equalized between the active portions 120-1 and 120-2, which are halved by the straight line 192.

The gate runner 48 of this example includes an annular portion 48-5 enclosing the temperature sense diode 178 in a top view. The annular portion 48-5 may also enclose a part of the temperature sense diode 178. The annular portion 48-5 of this example is arranged above the wide portion 115 illustrated in FIG. 1. The annular portion 48-5 may have a portion parallel to each end side of the wide portion 115. At least a part of the annular portion 48-5 may be arranged between the temperature sense diode 178 and the emitter electrode 52 (or the active portion 120) in a top view.

The annular portion 48-5 may be arranged such that it encloses the center Ac of the active portion 120. The straight line 192 may pass through the region enclosed by the annular portion 48-5. According to this example, the shape of the annular portion 48-5 in a top view can be approximately linearly symmetrical with respect to the straight line 192. Thus, the amplitude attenuation and transfer delay of the gate voltage can be equalized between the active portions 120-1 and 120-2, which are halved by the straight line 192.

The gate runner 48 of this example has a first extending portion 48-4a provided extending from the first well region 111 to the annular portion 48-5 in a top view. The first extending portion 48-4a is provided extending from the end of the annular portion 48-5 to the end of the active portion 120, and connects the annular portion 48-5 and the first well peripheral portion 48-1. The first extending portion 48-4a of this example is arranged above the intermediate well region 114 illustrated in FIG. 1. The first extending portion 48-4a may have a portion parallel to the straight line 192. The first extending portion 48-4a may be provided to overlap the straight line 192.

The gate runner 48 of this example has a second extending portion 48-4b provided extending from the second well region 112 to the annular portion 48-5 in a top view. The second extending portion 48-4b is provided extending from the end of the annular portion 48-5 to the end of the active portion 120, and connects the annular portion 48-5 and the second well peripheral portion 48-2. The first extending portion 48-4a and the second extending portion 48-4b are connected to different parts of the annular portion 48-5. The first extending portion 48-4a and the second extending portion 48-4b of this example are connected to both ends of the annular portion 48-5 in the X axis direction. The second extending portion 48-4b of this example is arranged above the intermediate well region 114 illustrated in FIG. 1. The second extending portion 48-4b may have a portion parallel to the straight line 192. The second extending portion 48-4b may be provided to overlap the straight line 192.

The first extending portion 48-4a, the second extending portion 48-4b and the annular portion 48-5 are arranged traversing in the X axis direction between the active portion 120-1 and the active portion 120-2. This enables each of the active portion 120-1 and the active portion 120-2 to be enclosed by the gate runner 48 in the configuration with the temperature sense diode 178. Thus, for each region of the active portion 120, the wiring distance from the gate pad 50 becoming longer can be suppressed. Accordingly, for each region of the active portion 120, the amplitude attenuation and transmission delay of the gate voltage can be equalized by reducing the variation of the wiring distance.

Figure 4:
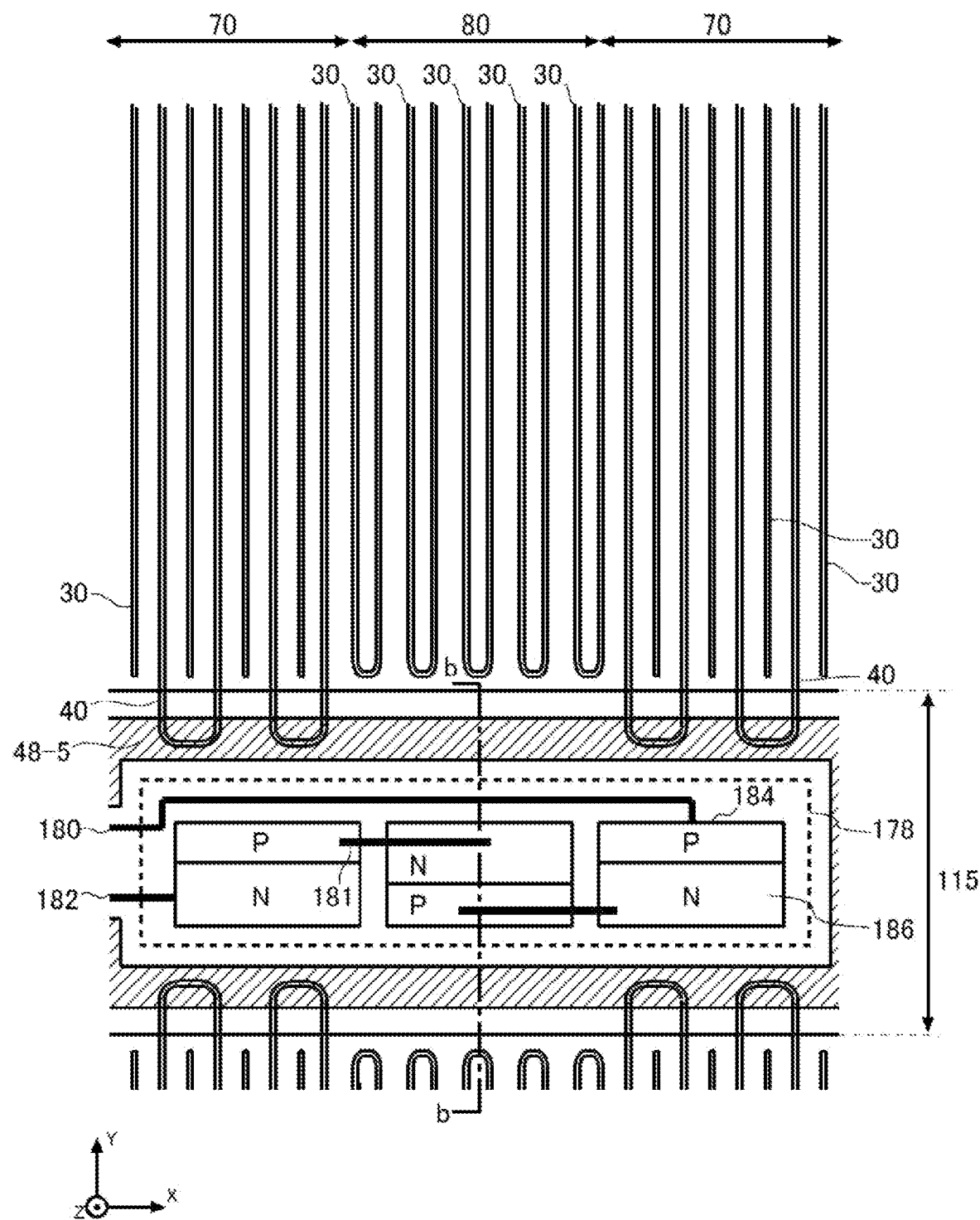
FIG. 4 illustrates an enlarged view of region A in FIG. 3.

FIG. 4 illustrates an enlarged view of region A in FIG. 3. The region A is the region including an annular portion 48-5 of the gate runner 48, a temperature sense diode 178, a transistor portion 70 and a diode portion 80. Additionally the arrangement of the gate runner 48 other than the annular portion 48-5 with respect to the transistor portion 70 and the diode portion 80 is the same as in the example of FIG. 4.

As described above, the temperature sense diode 178 of this example is enclosed by the annular portion 48-5 in a top view. The annular portion 48-5 is provided between the temperature sense diode 178 and the transistor portion 70, and between the temperature sense diode 178 and the diode portion 80. The wide portion 115 of the intermediate well region 114 is provided under the temperature sense diode 178 and the annular portion 48-5. The wide portion 115 may be provided up to the active portion 120 side than the annular portion 48-5. Additionally, the well regions other than the wide portion 115 have the same structure as the wide portion 115 described in FIG. 4 and so on.

The temperature sense diode 178 of this example has a plurality of PN junctions by cathode regions 186 of N type and anode regions 184 of P type. Each of the PN junctions is connected in series by the wiring 181. The wiring 181 is, for example, metal wiring. The anode region 184 of any of the PN junctions is connected to the cathode region 186 of another PN junction by the wiring 181. The plurality of PN junctions may be arrayed along the X axis direction. At least one PN junction may be provided at a position opposite the diode portion 80 in the Y axis direction. At least one PN junction may be provided at a position opposite the transistor portion 70 in the Y axis direction.

The semiconductor device 100 of this example includes a gate trench portion 40 and a dummy trench portion 30 provided in the interior of the upper surface side of the semiconductor substrate 10. The gate trench portion 40 is electrically connected with the gate runner 48, and the dummy trench portion 30 is electrically connected with the emitter electrode 52. The gate trench portion 40 is provided in the transistor portion 70, and the dummy trench portion 30 is provided in the diode portion 80. The dummy trench portion 30 may also be provided in transistor portion 70. The gate trench portion 40 and the dummy trench portion 30 have a longitudinal length in a predetermined longitudinal direction (in the Y axis direction in FIG. 4) on the upper surface of the semiconductor substrate 10.

The gate trench portion 40 of this example is provided extending up to a position overlapping the annular portion 48-5 of the gate runner 48, and is connected with the annular portion 48-5. Also, the dummy trench portion 30 may be terminated at a position that does not overlap the wide portion 115 in the Y axis direction. The dummy trench portion 30 may also be provided extending up to a position overlapping the wide portion 115. The dummy trench portion 30 may be connected with the emitter electrode 52 in the regions overlapping the wide portion 115.

Figure 5:
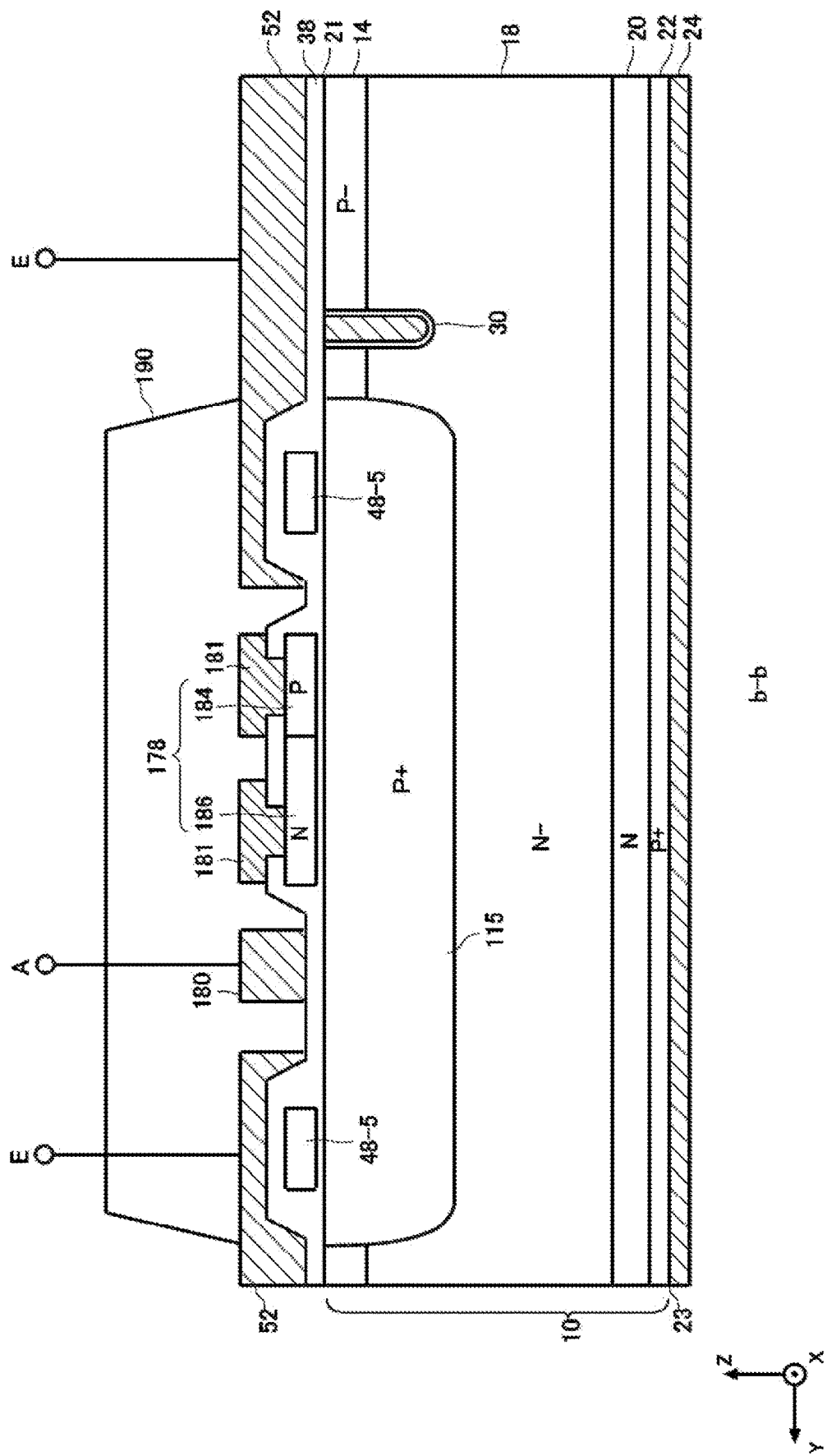
FIG. 5 illustrates one example of the cross section taken along b-b in FIG. 4.

FIG. 5 illustrates one example of a cross section taken along b-b in FIG. 4. The cross section taken along b-b is the YZ plane including the diode portion 80. In this example, the temperature sense diode 178, the annular portion 48-5 of the gate runner 48 and the emitter electrode 52 are provided above the upper surface 21 of the semiconductor substrate 10. An interlayer dielectric film 38 is provided between the upper surface 21 of the semiconductor substrate 10, and the temperature sense diode 178, the annular portion 48-5 and the emitter electrode 52. The interlayer dielectric film 38 may be a thermal oxide film, may be a glass layer such as BPSG, or may be other insulating films. In addition, the interlayer dielectric film 38 may also be a film in which a plurality of insulating films are stacked.

The annular portion 48-5 may be arranged sandwiching the temperature sense diode 178 in the Y axis direction. The emitter electrode 52 is provided in the range that does not overlap the temperature sense diode 178. The wide portion 115 of the well region is provided under the annular portion 48-5 and temperature sense diode 178. A protective film 190 such as polyimide is provided above the temperature sense diode 178 and the annular portion 48-5. The protective film 190 may cover a part of the emitter electrode 52. Wirings such as wires are connected to the surface of the emitter electrode 52, which is not covered by the protective film 190.

In the diode portion 80, a P− type base region 14 is provided in a region in contact with the upper surface 21 of the semiconductor substrate 10. The base region 14 functions as the anode region of the diode. The base region 14 may be provided from the diode portion 80 to a position in contact with the wide portion 115. The well region such as the wide portion 115 is a P type region formed from the upper surface 21 of the semiconductor substrate 10 to a depth deeper than the base region 14, and with a higher doping concentration than the base region 14.

A N− type drift region 18 is provided under the wide portion 115 and the base region 14. The drift region 18 is a region in the transistor portion 70 and the diode portion 80, where the carrier passes through in the depth direction. A N+ type cathode region is provided in a region in contact with the lower surface 23 of the semiconductor substrate 10 in the diode portion 80. The cathode region may be arranged away from the well region such as the wide portion 115 in a top view. In this example, except for the diode portion 80, the region in contact with the lower surface 23 of the semiconductor substrate 10 may be the P+ type collector region 22. Also, an N type buffer region 20 may be provided between the drift region 18, and the cathode region and the collector region 22. A collector electrode 24 may be provided under the cathode region and collector region 22.

Figure 6:
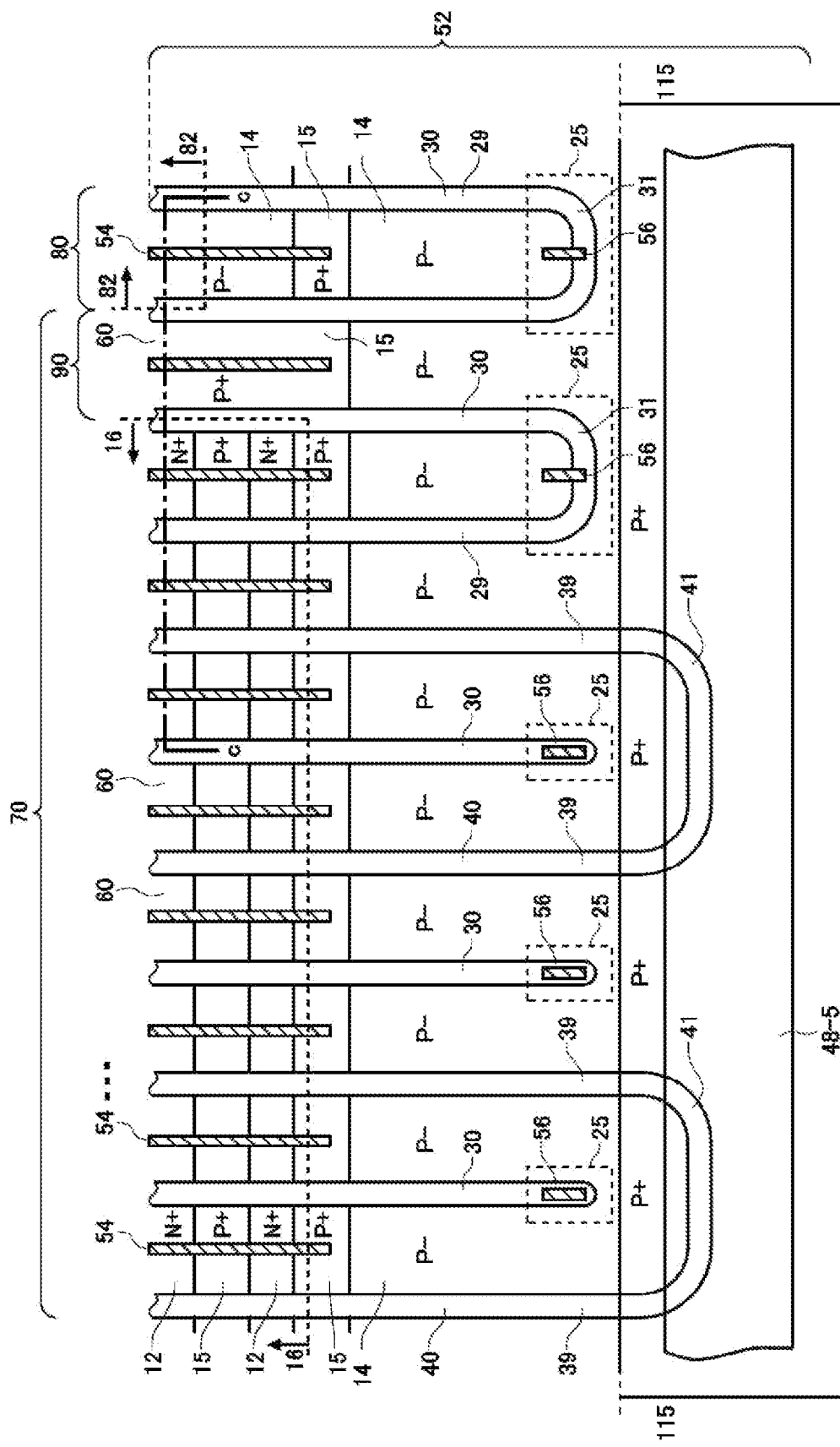
FIG. 6 illustrates a top view that partially enlarges a transistor portion 70 and a diode portion 80 in FIG. 4.

FIG. 6 illustrates a partially enlarged top view of the transistor portion 70 and the diode portion 80 in FIG. 4. FIG. 6 enlarges the vicinity of the annular portion 48-5 of the gate runner 48. The semiconductor device 100 of this example includes well regions such as the gate trench portion 40 provided in the interior of the upper surface side of the semiconductor substrate 10, the dummy trench portion 30 and the wide portion 115, a emitter region 12, a base region 14 and a contact region 15. In FIG. 6, the vicinity of the wide portion 115 is enlarged, but the transistor portion 70 and the diode portion 80 have the same structure in the vicinity of the first well region 111, the second well region 112, the peripheral well region 113 and the intermediate well region 114.

FIG. 6 illustrates the range where the emitter electrode 52 is provided. The emitter electrode 52 of this example is provided in the range overlapping the annular portion 48-5, but may also be provided in the range not overlapping the annular portion 48-5. An interlayer dielectric film is provided in between the emitter electrode 52 and the upper surface 21 of the semiconductor substrate 10, but this is omitted in FIG. 6. Contact holes 56 and contact holes 54 are provided in the interlayer dielectric film in this example, penetrating the interlayer dielectric film.

The emitter electrode 52 is in contact with the emitter region 12, the contact region 15 and the base region 14 on the upper surface 21 of the semiconductor substrate 10 through the contact holes 54. Also, the emitter electrode 52 is connected with the dummy conductive portion within the dummy trench portion 30 through the contact holes 56. A connecting portion 25 formed by conductive materials such as polysilicon doped by impurities, may be provided between the emitter electrode 52 and the dummy conductive portion. The connecting portion 25 is provided on the upper surface of the semiconductor substrate. An insulating film such as a thermal oxide film is provided between the connecting portion 25 and the semiconductor substrate.

An insulating film such as a thermal oxide film is provided between the annular portion 48-5 and the semiconductor substrate 10. The annular portion 48-5 is connected with the gate conductive portion within the gate trench portion 40 on the upper surface 21 of the semiconductor substrate 10. The annular portion 48-5 is not connected with the dummy conductive portion within the dummy trench portion 30. The annular portion 48-5 of this example is provided to overlap the edge portion 41 of the gate trench portion 40. The edge portion 41 is the end closest to the annular portion 48-5 in the gate trench portion 40. The gate conductive portion is exposed on the upper surface of the semiconductor substrate in the edge portion 41 of the gate trench portion 40, and is in contact with the annular portion 48-5.

The emitter electrode 52 is form by materials containing metals. For example, at least a part of the region of the emitter electrode 52 is formed by aluminum or aluminum-silicon alloy. The emitter electrode 52 may have barrier metals formed by titanium or titanium compounds or the like in the bottom layer of the region formed by aluminum and so on. In addition, there may also be a plug formed by embedding tungsten or the like in the contact holes so as to be in contact with the barrier metal and aluminum or the like.

One or more gate trench portions 40 and one or more dummy trench portions 30 are arrayed at predetermined intervals along a predetermined array direction in the region of the transistor portion 70. The array direction in FIG. 6 is the X axis direction. In the transistor portion 70, one or more gate trench portions 40 and one or more dummy trench portions 30 may be provided alternately along the array direction.

The gate trench portion 40 of this example may have two extending portions 39 that extend along the extending direction perpendicular to the array direction (the portions of the trench that are straight along the extending direction), and an edge portion 41 that connects the two extending portions 39. The extending direction in FIG. 6 is the Y axis direction. At least a part of the edge portion 41 should be provided as curved. In the two extending portions 39 of the gate trench portion 40, the electric field concentration at the ends of the extending portions 39 can be relaxed by connecting the edge portions 41 to each other, which are straight ends along the extending direction.

The dummy trench portions 30 of this example is provided between each of the extending portions 39 of the gate trench portion 40. These dummy trench portions 30 may have a linear shape that extends in the extending direction.

In the transistor portion 70, the boundary in direct contact with the diode portion 80 may include an intermediate region 90 with no emitter region on the surface. Also, in the transistor portion 70, a plurality of dummy trench portions 30 may be consecutively arrayed in a portion in direct contact with the intermediate region 90. The dummy trench portions 30 provided in the portion in direct contact with the intermediate region 90 may have extending portions 29 and edge portions 31. The edge portion 31 and the extending portion 29 have the same shape as the edge portion 41 and the extending portions 39. The length in the extending direction of the dummy trench portions 30 with the edge portions 31 and the linearly shaped dummy trench portions 30 may be the same.

The emitter electrode 52 is provided above the gate trench portion 40, the dummy trench portions 30, the wide portion 115, the emitter region 12, the base region 14 and the contact region 15. The wide portion 115 is provided in a predetermined range away from the contact holes 54. Also, in this example, wide portion 115 is provided in a predetermined range away from the contact holes 56. The diffusion depth of the wide portion 115 may be deeper than the depth of the gate trench portion 40 and the dummy trench portions 30. The end of the gate trench portion 40 in the extending direction may be provided in the wide portion 115.

A base region 14 is provided in the mesa portion 60 sandwiched by each trench portion. The mesa portion is the region on the upper surface side above the deepest bottom portion of the trench portion, among the portions of semiconductor substrate 10 sandwiched by the trench portions. The base region 14 is a second conductive type with a lower doping concentration than the wide portion 115.

On the upper surface of the base region 14 of the mesa portion 60, a second conductive type contact region 15 with a higher doping concentration than the base region 14 is provided. The contact region 15 of this example is of P+ type. The wide portion 115 may be provided away from the contact region 15 that is arranged at the farthest end of the contact region 15 in the extending direction of the trench portion, in the direction of the annular portion 48-5. Also, in the transistor portion 70, a first conductive type emitter region 12 with a higher doping concentration than the semiconductor substrate 10, is selectively provided on a portion of the upper surface of the contact region 15. The emitter region 12 of this example is of N+ type.

Each of the contact region 15 and the emitter region 12 is provided from one adjacent trench portion to another trench portion. One or more contact regions 15 and one or more emitter regions 12 of the transistor portion 70 are provided to be exposed alternately on the upper surface of the mesa portion 60 along the extending direction of the trench portions.

In other examples, the contact regions 15 and the emitter regions 12 may also be provided in the mesa portion 60 in the transistor portion 70 in a striped pattern along the extending direction. For example, the emitter regions 12 are provided in regions in direct contact with the trench portions, and the contact regions 15 are provided in regions sandwiched by the emitter regions 12.

The emitter regions 12 may not be provided in the mesa portion 60 of the diode portion 80. Also, the contact regions 15 are provided in the mesa portion 60 of the intermediate region 90 over a larger area than the mesa portion 60 of the transistor portion 70.

In the transistor portion 70, the contact holes 54 are provided above each region of the contact regions 15 and the emitter regions 12. The contact holes 54 are not provided in a region corresponding to the base region 14 and the wide portion 115. In the diode portion 80, contact holes 54 are provided above the contact region 15 and the base region 14.

In the diode portion 80, an N+ type cathode region 82 is provided in a region in direct contact with the lower surface 23 of the semiconductor substrate 10. In FIG. 6, the region where the cathode region 82 is provided is illustrated by dotted lines. A P+ type collector region may be provided in a region where the cathode region 82 is not provided, in a region in direct contact with the lower surface 23 of the semiconductor substrate 10. FIG. 6 illustrates one mesa portion 60 of the diode portion 80, but there may be a plurality of mesa portions 60 in the X axis direction.

A N+ type accumulation region 16 is provided in the at least a part of the region of the transistor portion 70. In FIG. 6, the region where the accumulation region 16 is provided is illustrated by dotted lines. The accumulation region 16 may be provided under the emitter region 12 or the contact region 15 in each mesa portion 60.

Figure 7:
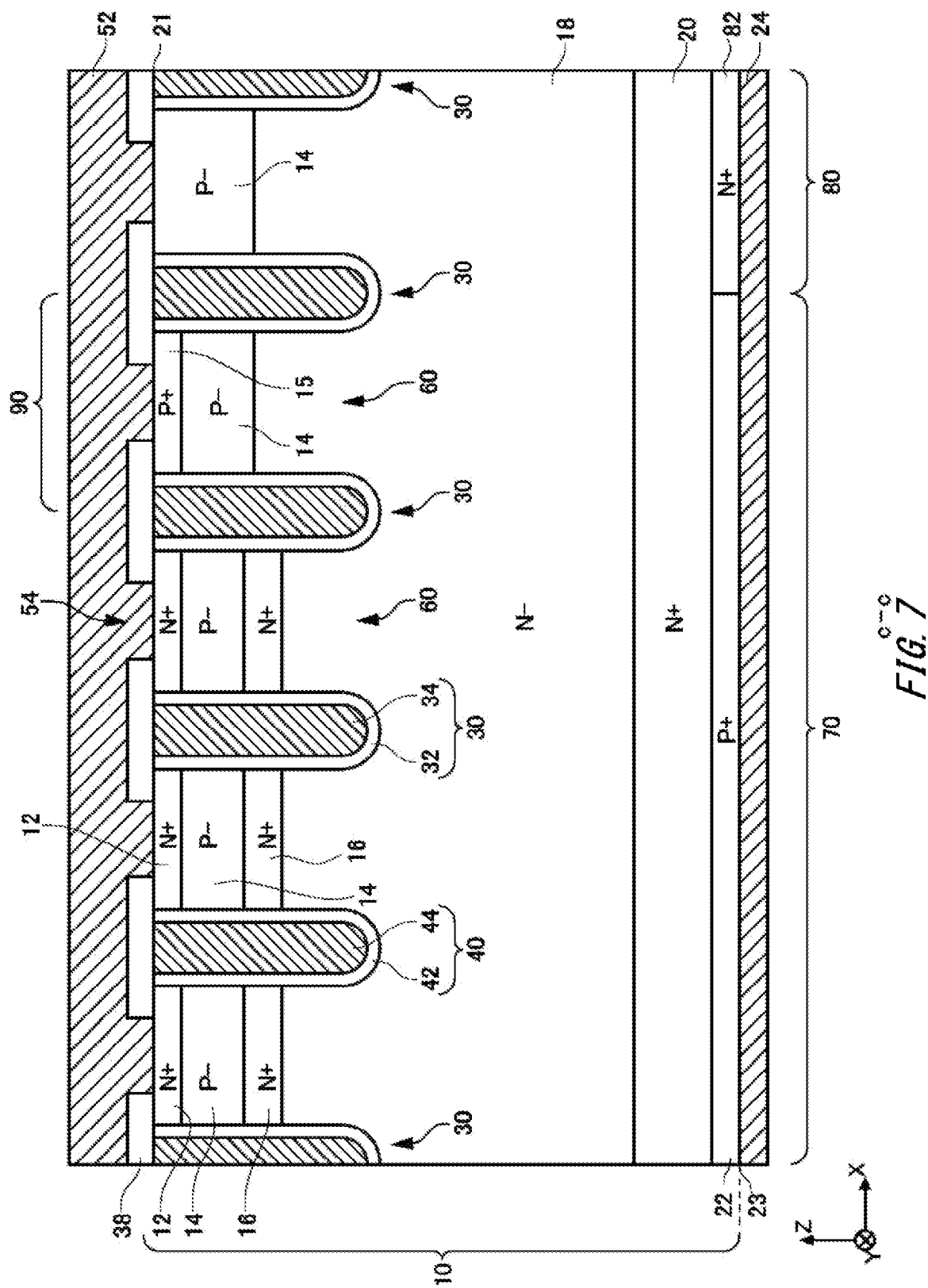
FIG. 7 illustrates one example of the cross section taken along c-c in FIG. 6.

FIG. 7 illustrates one example of the cross section taken along c-c in FIG. 6. The cross section taken along c-c is the XZ plane passing through the emitter region 12. The semiconductor device 100 of this example has a semiconductor substrate 10, an interlayer dielectric film 38, an emitter electrode 52 and a collector electrode 24 in the cross section. The emitter electrode 52 is provided on the upper surface of the semiconductor substrate 10 and the interlayer dielectric film 38.

The collector electrode 24 is provided on the lower surface 23 of the semiconductor substrate 10. The emitter electrode 52 and the collector electrode 24 are provided by conductive materials such as metals. In this specification, the depth direction is referred to as the direction connecting the emitter electrode 52 and the collector electrode 24.

The semiconductor substrate 10 may be a silicon substrate, may be a silicon carbide substrate, and may also be a nitride semiconductor substrate such as gallium nitride and so on. The semiconductor substrate 10 of this example is a silicon substrate. On the upper surface 21 of the semiconductor substrate 10 in the cross section, a P– type base region 14 is provided.

In the cross section, on the upper surface 21 of the semiconductor substrate 10 of the transistor portion 70, an N+ type emitter region 12, a P– type base region 14, and an N+ type accumulation region 16 are provided in order from the upper surface 21 of the semiconductor substrate 10.

In the cross section, on the upper surface 21 of the semiconductor substrate 10 of the diode portion 80, a P– type base region 14 is provided. The accumulation region 16 is not provided in the diode portion 80 of this example. In other examples, the accumulation region 16 may also provide in the diode portion 80. Also, on the upper surface 21 of the semiconductor substrate 10 of intermediate region 90, a contact region 15 is provided.

A N– type drift region 18 is provided under the accumulation region 16 in the transistor portion 70. By providing the accumulation region 16 with a higher concentration than the drift region 18 between the drift region 18 and the base region 14, the carrier injection enhancement effect (IE effect) can be enhanced and the on-voltage can be reduced.

The accumulation region 16 of this example is provided in each mesa portion 60 of the transistor portion 70. The accumulation region 16 may be provided to cover the entire lower surface of the base region 14 of each mesa portion 60. In the diode portion 80, a drift region 18 is provided on the lower surface of the base region 14. In both of the transistor portion 70 and the diode portion 80, an N+ type buffer region 20 is provided under the drift region 18.

The buffer region 20 is provided under the drift region 18. The doping concentration of the buffer region 20 is higher than the doping concentration of the drift region 18. The buffer region 20 may function as a field stop layer that prevents the depletion layer extending from the lower surface of the base region 14 from reaching the P+ type collector region 22 and the N+ type cathode region 82.

In the transistor portion 70, a P+ type collector region 22 is provided under the buffer region 20. In the diode portion 80, an N+ type cathode region 82 is provided under the buffer region 20. Also, in the active portion 120, the transistor portion 70 is the projected area when the collector region 22 is projected against the upper surface 21 of the semiconductor substrate 10 in a direction perpendicular to the lower surface 23 of the semiconductor substrate 10, and the area in which the predetermined unit configurations, including the emitter regions 12 and the contact regions 15, are regularly arranged.

On the upper surface 21 of the semiconductor substrate 10, one or more gate trench portions 40 and one or more dummy trench portions 30 are provided. Each trench portion is provided to reach the drift region 18 by penetrating the base region 14 from the upper surface 21 of the semiconductor substrate 10. In the region where at least any one of the emitter region 12, the contact region 15 and the accumulation region 16 is provided, each trench portion reaches the drift region 18 by penetrating these regions. The trench portion penetrating the doping region is not limited to those manufactured in the order in which the doping region is formed and then the trench portion is formed. After the formation of the trench portions, a doping region formed between the trench portions is also included in the one in which the trench portions penetrate the doping region.

The gate trench portion 40 has a gate insulating film 42 and a gate conductive portion 44 provided on the upper surface 21 of the semiconductor substrate 10. The gate insulating film 42 is provided to cover the inner wall of the gate trench portion 40. The gate insulating film 42 may be formed by oxidizing or nitrifying the semiconductor on the inner wall of the gate trench portion 40. The gate conductive portion 44 is provided inside the gate insulating film 42 in the interior of the gate trench portion 40. That is, the gate insulating film 42 insulates the gate conductive portion 44 from the semiconductor substrate 10. The gate conductive portion 44 is formed by conductive materials such as polysilicon.

The gate conductive portion 44 includes a region opposite the base region 14 sandwiching the gate insulating film 42. The gate trench portion 40 in the cross section is covered by the interlayer dielectric film 38 on the upper surface 21 of the semiconductor substrate 10. When a predetermined voltage is applied to the gate conductive portion 44, a channel with an inverted layer of electrons is formed in the surface layer of the interface in contact with the gate trench of the base region 14.

In the cross section, the dummy trench portions 30 may have the same structure as the gate trench portion 40. The dummy trench portions 30 has a dummy trench, a dummy insulating film 32 and a dummy conductive portion 34 provided on the upper surface 21 of the semiconductor substrate 10. The dummy insulating film 32 is provided to cover the inner wall of the dummy trench. The dummy conductive portion 34 is provided inside the dummy insulating film 32, in the interior of the dummy trench. The dummy insulating film 32 insulates the dummy conductive portion 34 from the semiconductor substrate 10. The dummy conductive portion 34 may be formed by the same materials as the gate conductive portion 44.

Figure 8:
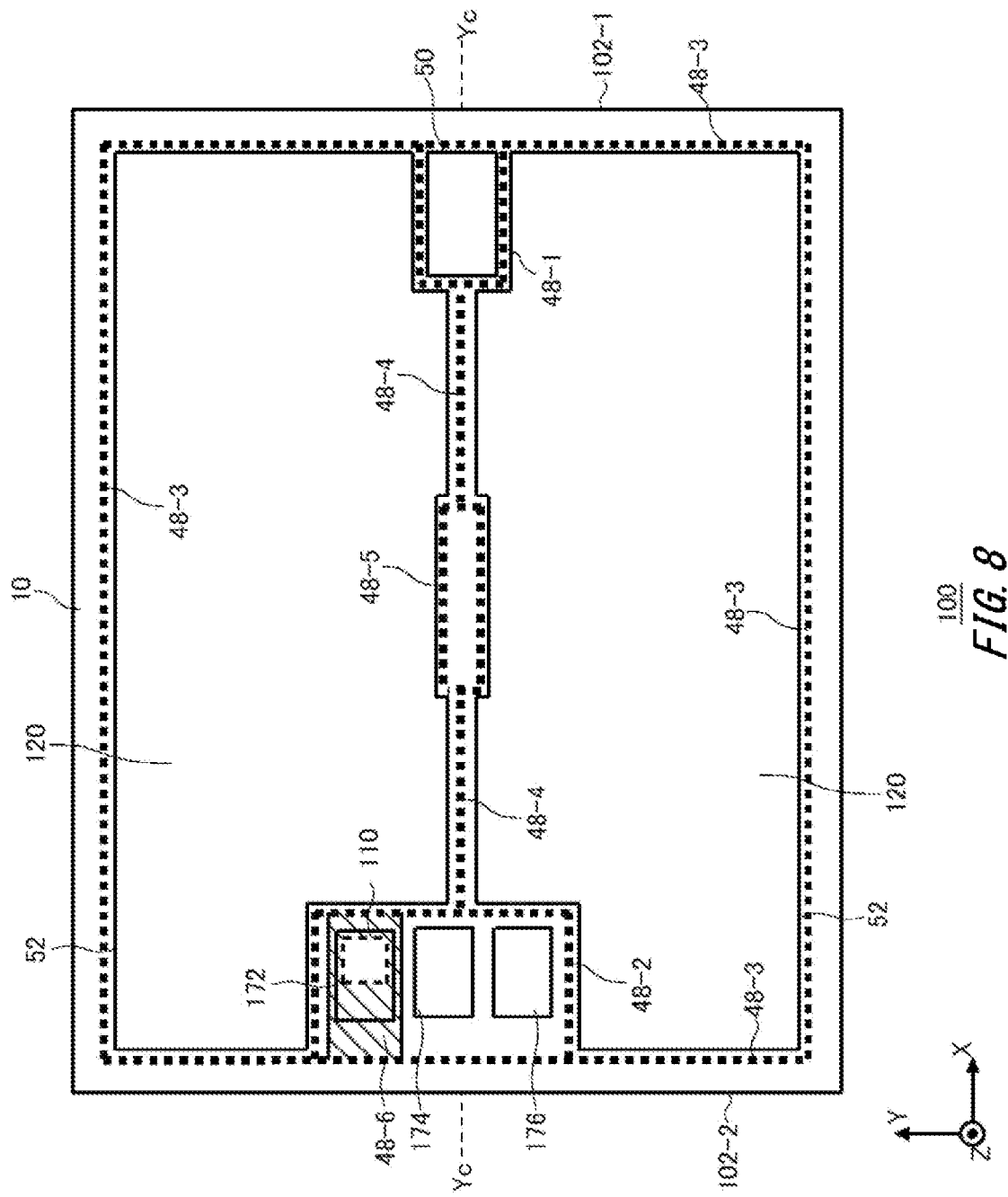
FIG. 8 illustrates a top view of another exemplary arrangement of the gate runner 48.

FIG. 8 illustrates a top view of another exemplary arrangement of the gate runner 48. The gate runner 48 in this example further has a current sensor peripheral portion 48-6 as compared to the example described in FIG. 1 to FIG. 7. The current sensor peripheral portion 48-6 is provided to enclose the current detection portion 110 in a top view. The current sensor peripheral portion 48-6 may be arranged inside the region enclosed by the second well peripheral portion 48-2. The second well peripheral portion 48-2 of this example has two linear portions extending along the Y axis direction. The current sensor peripheral portion 48-6 may be provided from the linear portion on one side to the linear portion on the other side. The width of the current sensor peripheral portion 48-6 in the Y axis direction may be greater than the width of the current detection portion 110 in the Y axis direction.

Figure 9:
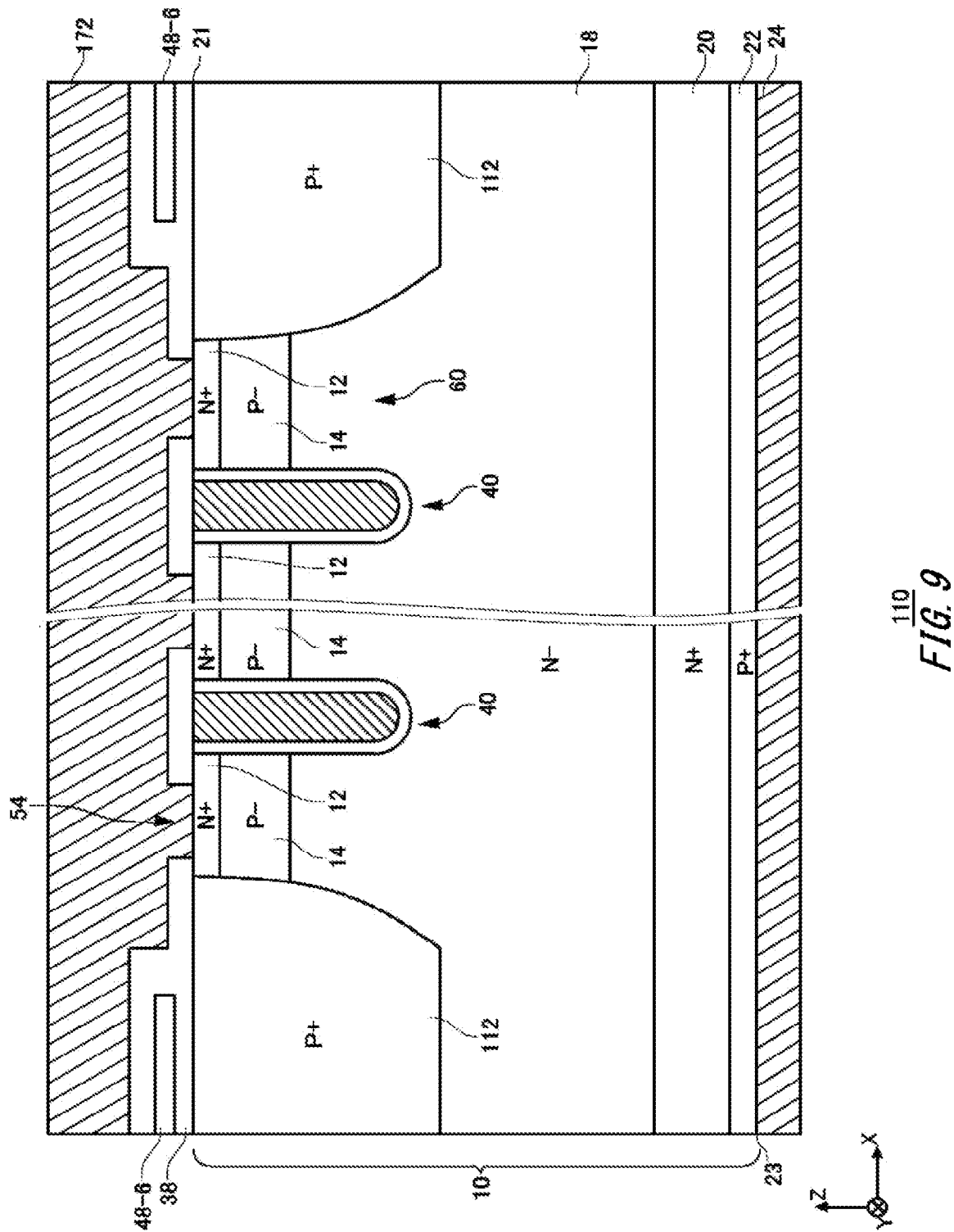
FIG. 9 illustrates one example of the XZ cross section of a current detection portion 110.

FIG. 9 illustrates one example of an XZ cross section of the current detection portion 110. The current detection portion 110 is enclosed by the second well region 112. The current detection portion 110 of this example has one or more gate trench portions 40 and one or more mesa portions 60.

The structure of the gate trench portion 40 of the current detection portion 110 may be the same as the structure of the gate trench portion 40 of the transistor portion 70. The gate trench portion 40 of the current detection portion 110 is connected with the current sensor peripheral portion 48-6. The density per unit area of the gate trench portion 40 of the current detection portion 110 may be higher than the density per unit area of the gate trench portion 40 of the transistor portion 70. The current detection portion 110 may be provided with a plurality of gate trench portions 40, but not with a dummy trench portion 30.

The mesa portion 60 of the current detection portion 110 may have the same structure as the mesa portion 60 of the transistor portion 70. The emitter regions 12 and the base regions 14 are provided in the mesa portion 60 of the current detection portion 110. This enables the current detection portion 110 to operate in the same manner as the transistor portion 70. An accumulation region 16 may or may not be provided in the mesa portion 60 of the current detection portion 110.

The mesa portion 60 of the current detection portion 110 is connected with the current detection pad 172. The current detection pad 172 may be connected with the mesa portion 60 through a through-hole provided in the current sensor peripheral portion 48-6. The upper surface of the mesa portion 60 of the current detection portion 110 may have the same structure as the upper surface of the mesa portion 60 of the transistor portion 70. For example, the emitter regions 12 and the contact regions 15 may be alternately arranged along the Y axis direction on the upper surface of the mesa portion 60 of the current detection portion 110.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES

10: semiconductor substrate; 12: emitter region; 14: base region; 15: contact region; 16: accumulation region; 18: drift region; 20: buffer region; 21: upper surface; 22: collector region; 23: lower surface; 24: collector electrode; 25: connecting portion; 29: extending portion; 30: dummy trench portion; 31: edge portion; 32: dummy insulating film; 34: dummy conductive portion; 38: interlayer dielectric film; 39: extending portion; 40: gate trench portion; 41: edge portion; 42: gate insulating film; 44: gate conductive portion; 48: gate runner; 48-1: the first well peripheral portion; 48-2: the second well peripheral portion; 48-3: active peripheral portion; 48-4a: the first extending portion; 48-4b: the second extending portion; 48-5: annular portion; 48-6: current sensor peripheral portion; 50: gate pad; 52: emitter electrode; 54: contact hole; 56: contact hole; 60: mesa portion; 70: transistor portion; 80: diode portion; 82: cathode region; 90: intermediate region; 100: semiconductor device; 102: end side; 110: current detection portion; 111: the first well region; 112: the second well region; 113: peripheral well region; 114: intermediate well region; 115: wide portion; 120: active portion; 172: current detection pad; 174: anode pad; 176: cathode pad; 178: temperature sense diode; 180: anode wiring; 181: wiring; 182: cathode wiring; 184: anode region; 186: cathode region; 190: protection layer; 192: straight line

What is claimed is:

1. A semiconductor device comprising:
a semiconductor substrate;
an active portion provided on the semiconductor substrate;
a first well region and a second well region provided on the semiconductor substrate and arranged sandwiching the active portion in a top view;
a peripheral well region provided on the semiconductor substrate and arranged enclosing the active portion in a top view;
an intermediate well region provided on the semiconductor substrate and arranged between the first well region and the second well region in a top view, wherein the intermediate well region is provided from the first well region to the second well region in a top view;
a first pad arranged above the first well region and a second pad arranged above the second well region; and
a temperature sense diode arranged above the intermediate well region.

2. The semiconductor device according to claim 1, wherein
the first well region and the second well region protrude more to a center side of the active portion than the peripheral well region.

3. The semiconductor device according to claim 2, wherein
the semiconductor substrate has a first end side and a second end side facing each other in a top view;
the first well region is arranged between the active portion and the first end side; and
the second well region is arranged between the active portion and the second end side.

4. The semiconductor device according to claim 3, further comprising a gate runner connected to the first pad is further provided; wherein
the first pad is arranged in center of the first end side.

5. The semiconductor device according to claim 4 wherein the gate runner comprises:
an active peripheral portion enclosing the active portion in a top view;
a first well peripheral portion enclosing the first well region in a top view; and
a second well peripheral portion enclosing the second well region in a top view.

6. The semiconductor device according to claim 5, wherein
the first well peripheral portion is arranged in the center of first end side; and
the second well peripheral portion is arranged in the center of the second end side.

7. The semiconductor device according to claim 1, wherein
the semiconductor substrate has a first end side and a second end side facing each other in a top view;
the first well region is arranged between the active portion and the first end side; and
the second well region is arranged between the active portion and the second end side.

8. The semiconductor device according to claim 7, further comprising a gate runner connected to the first pad is further provided; wherein
the first pad is arranged in center of the first end side.

9. The semiconductor device according to claim 8 wherein the gate runner comprises:
an active peripheral portion enclosing the active portion in a top view;
a first well peripheral portion enclosing the first well region in a top view; and
a second well peripheral portion enclosing the second well region in a top view.

10. The semiconductor device according to claim 9, wherein
the first well peripheral portion is arranged in the center of first end side; and
the second well peripheral portion is arranged in the center of the second end side.

11. The semiconductor device according to claim 8, wherein the gate runner comprises:
an annular portion enclosing the temperature sense diode in a top view;
a first extending portion provided from the first well region to the annular portion; and a second extending portion provided from the second well region to the annular portion.

12. The semiconductor device according to claim 1, wherein
the intermediate well region has a wide portion having a width that is wider than other portions in a direction in which the first well region and the second well region are connected in a top view;
the temperature sense diode is arranged above the wide portion.

13. A semiconductor device, comprising:
a semiconductor substrate;
an active portion provided on the semiconductor substrate;
a gate runner provided on the semiconductor substrate and arranged traversing the active portion in a top view; and
a temperature sense diode arranged above the semiconductor substrate;
wherein the gate runner comprises:
an annular portion enclosing the temperature sense diode in a top view, wherein the annular portion is provided adjacent to all sides of the temperature sense diode;
a first extending portion extending from one end of the annular portion to one end of the active portion; and
a second extending portion extending from another end of the annular portion to the other end of the active portion.

14. The semiconductor device of claim 13, wherein the active portion comprises at least one transistor portion and at least one diode portion.

15. The semiconductor device of claim 14, wherein the annular portion is provided between the temperature sense diode and the transistor portion.

16. The semiconductor device of claim 14, wherein the annular portion is provided between the temperature sense diode and the diode portion.

17. A semiconductor device comprising:
a semiconductor substrate, wherein the semiconductor substrate has a first end side and a second end side facing each other in a top view;
an active portion provided on the semiconductor substrate;
a first well region and a second well region provided on the semiconductor substrate and arranged sandwiching the active portion in a top view, wherein the first well region is arranged between the active portion and the first end side and the second well region is arranged between the active portion and the second end side;
a peripheral well region provided on the semiconductor substrate and arranged enclosing the active portion in a top view;
an intermediate well region provided on the semiconductor substrate and arranged between the first well region and the second well region in a top view;
a first pad arranged above the first well region and a second pad arranged above the second well region;
a temperature sense diode arranged above the intermediate well region; and
a gate runner connected to the first pad, wherein the first pad is arranged in center of the first end side, wherein the gate runner comprises:
an annular portion enclosing the temperature sense diode in a top view,
a first extending portion provided from the first well region to the annular portion, and
a second extending portion provided from the second well region to the annular portion.

* * * * *